United States Patent [19]

Motamedi

[11] Patent Number: 4,589,009
[45] Date of Patent: May 13, 1986

[54] NON-VOLATILE PIEZOELECTRIC MEMORY TRANSISTOR

[75] Inventor: Manouchehr E. Motamedi, Thousand Oaks, Calif.

[73] Assignee: The United States of America as represented by the Secretary of the Army, Washington, D.C.

[21] Appl. No.: 659,044

[22] Filed: Oct. 9, 1984

[51] Int. Cl.⁴ .................... H01L 29/78; H01L 29/84; H01L 27/02; H01L 29/04
[52] U.S. Cl. .................................. 357/54; 357/23.5; 357/23.4; 357/23.15; 357/26; 357/41; 357/59; 365/185
[58] Field of Search ............. 357/23.4, 23.5, 23.15, 357/26, 41, 54, 59; 365/185

[56] References Cited

U.S. PATENT DOCUMENTS

| | | | |
|---|---|---|---|
| 3,585,415 | 6/1971 | Muller et al. | 357/23.15 |
| 3,878,549 | 4/1975 | Yamazaki et al. | 357/54 |
| 4,161,039 | 7/1979 | Rössler | 357/23.5 |

FOREIGN PATENT DOCUMENTS

| | | | |
|---|---|---|---|
| 57-91561 | 6/1982 | Japan | 357/23.5 |
| 2129611 | 5/1984 | United Kingdom | 357/23.5 |

OTHER PUBLICATIONS

K. W. Yeh et al., "Detection of Acoustic Waves with a PI–DMOS Transducer," *Japanese Journal of Applied Physics*, vol. 16 (1977), Supplement 26-1, pp. 517–521.

*Primary Examiner*—James J. Carroll
*Attorney, Agent, or Firm*—Anthony T. Lane; Robert P. Gibson; Robert C. Sims

[57] ABSTRACT

A piezoelectric double diffusion MOS structure in which three gates are inserted in the CVD oxide element. These gates are overlapped layers of CVD polysilicon on top of the ZnO and are capacitively coupled to the silicon substrate. The charge is placed on the middle floating gate and is retained because of the oxide layers which separate the gates. A program erase, gate is provided for discharging the floating gate and to set the modes.

3 Claims, 2 Drawing Figures

NON-VOLATILE PIEZOELECTRIC MEMORY TRANSISTOR

DEDICATORY CLAUSE

The invention described herein was made in the course of or under a contract or subcontract thereunder with the Government for governmental purposes without the payment to me of any royalties thereon.

DESCRIPTION OF THE BEST MODE AND PREFERRED EMBODIMENT

Figure 1:
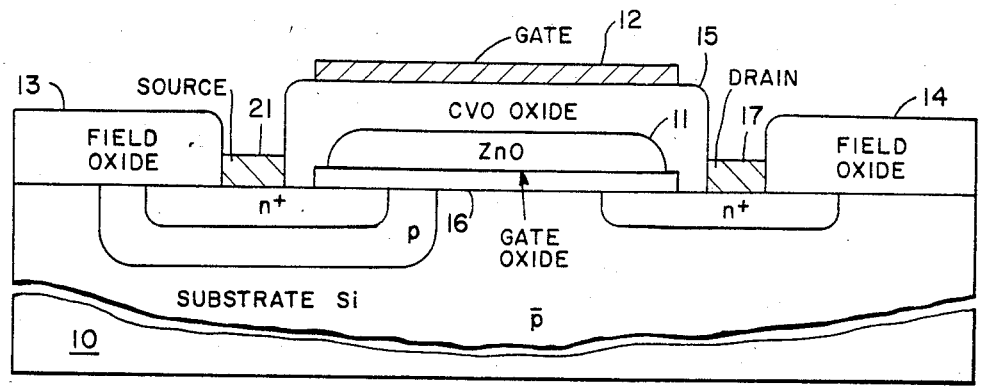
FIG. 1 illustrates a prior art transistor device.

FIG. 1 is an illustration of a PI-DMOS transistor convolver. For a detailed description of this device see "A Monolithic ZnO/Si PI-DMOS Convolver" by A. E. Comer and R. S. Muller in the 1981 Ultrasonics symposium, 0090-5607/81/0000-0240, 1981 IEEE, pages 240-242. The Piezoelectric Double Diffusion MOS (PI-DMOS) structure as shown in FIG. 1 can be used as a memory corralator when it is integrated in the propagation path of surface acoustic wave (SAW) transducers. Based on the existance of interfacial traps in the zinc oxide ZnO films 11 on silicon when multilayer ZnO films are incorporated into the DMOS gate 12, these traps could be emptied by applying bias voltage and/or illuminating with white light. The transistor is on a silicon substrate 10.

As the surface wave propagates through the PI-DMOS, a very short write pulse, much shorter than the surface wave period, would be applied to the structure. If the pulse were applied to the gate 16, charging of the traps would be primarily a tunneling phenomena involving only the oxide layers 13-16. A second approach would be to avalanche the drain diode 17 which would create a cloud of hot electrons which could subsequently tunnel into the interface states. Either actions could cause the traps to fill and superimpose upon the stored charges which would be a replica of a surface wave generated polarization voltage. At any later time, short relative to the trap life time, a second surface wave would be input to the device and correlated with the holographically stored surface wave pattern.

NONVOLATILE PIEZOELECTRIC MEMORY TRANSISTOR

Figure 2:
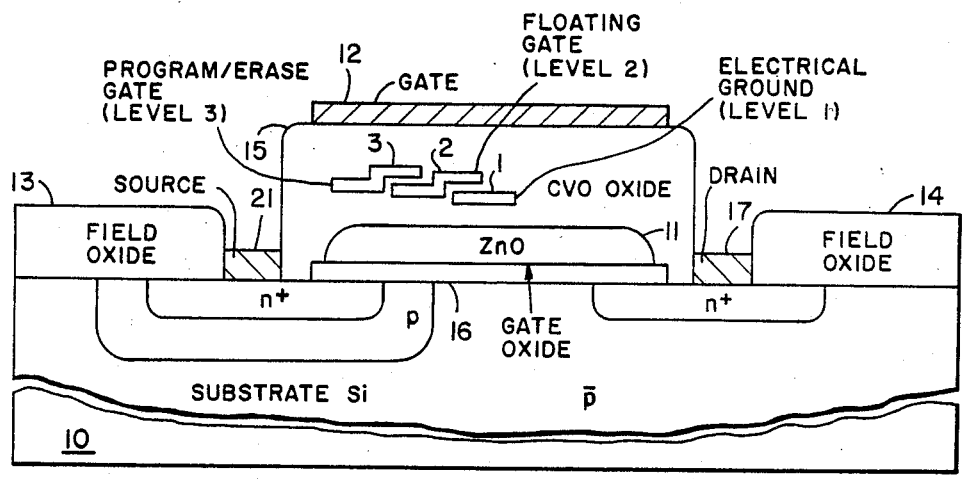
FIG. 2 is an illustration of the structure of the present invention.

Piezoelectric floating gate double—diffusion metal oxide semiconductor (PI-FDMOS), shown in FIG. 2, can replace a PI-DMOS memory corrolator when very large time bandwidth is required. By adding the three over-lapped layers 1-3 of CVD polysilicon on top of the ZnO, memory time is enhanced by orders of magnitude. This is due to the fact that the floating gate 2 is surrounded by the CVD oxide 15 (or nitide); therefore the charge will be held in the gate for a much longer time. Practically speaking it will remain trapped indefinitely.

This approach to holographic memory for SAW correlators is unique. The gate is easily fabricated by using low-pressure chemical vapor deposition processes. The polysilicon electrodes are separated by oxide layers 1000 Å thick. The layers of CVD oxide can be partially replaced to silicon nitride. There are several processing keys for successful fabrication of this device:

(a) Because of the ZnO film, covering the drift regions and effective channel areas, is in the order of only a few microns, a dry etching technique of the ZnO should be used by RIE method and HI gas.

(b) Since ZnO film thickness is in the order of several hundreds of Angstrons, it can be used as a self aligned technique for DMOS fabrication.

(c) To increase the isolation of the device, a silicon nitride field oxidation technique can be used for the field oxide.

A simpler modification of the device in the FIG. 2 is a PMOS or NMOS transistor. In this kind of the structures the memory aspect of the device is more important as compared to the high frequency performance of the device. It is also possible to use the same technique for making Nonvolatile Piezoelectric Memory device in passive SAW convolver/collerators like MZOS memory correlators.

In brief, a floating gate is an island of conductive material surrounded by oxide and coupled capacitively to the silicon substrate to form a transistor. The presence and absence of charge on the floating gate 2 determines whether the transistor is on or off. This charge once on the floating gate 2, will remain trapped indefinitely since the oxide normally acts as a barrier to the flow of current.

The method of charge storing and erasing is as follows: For changing the floating gate, the electrodes 3 at level 3 is brought to a positive voltage, where it capacitively couples the floating gate 2 (level 2) to a positive potential. The electrode 1 at level 1 is held at the ground potential and, with a large enough electric field, emits electrons that are captured by the floating gate, making it negative. For erasing, the floating gate 2 is held close to the ground potential while the control electrode (level 3) is brought high. With established electric field between control electrode 3 and floating gate 2, the floating gate emits electrons so that it becomes positively charged. The DMOS is biased and the proper signals are generated for Program/Erase actions. Proper voltage is applied to the source 21.

The key mechanism for a SAW memory correlator using the floating gate memory is the ability to charge the floating gate quickly in the presence of RF electric fields from the surface wave. When the memory is being programmed, the SAW reference signal should be within the interaction region of the PI-FDMOS. Also the floating gates should have a periodicity which satisfies Nyguist Sampling Criteria. This in effect freezes the surface wave charge distributions under the gate.

Floating gate level 2 should cover the effective channel length of the DMOS. By holding the program/erase gate 3 level to the right polarity with respect to ground, the following gate 2 will be charged to an amount that is a function of spatial charge distribution under the gate. The charging action of the floating gate can be performed in a very short time. If an RF electric field spatially existed under the floating gate as a result of SAW propagation, the amplitude of this wave will be modulated to the charge distribution of the floating gate. To erase the memory the gate 3 should be connected to the ground. This is the principle of the nonvolatile memory by a piezoelectric active device.

The addition of piezoelectric oxide and floating gates in a Metal Oxide Semiconductor Field Effect Transistor (MOSFET) structure results in ability to store stress induced charges. This effect can be used for storing coded waveform for signal processing i.e., large time-bandwidth convolution and correlation.

The inventive points are: (1) The floating gate memory will enhance the memory effects of ZnO gates like MZOS memory correlators. (2) The active device has larger SAW signal processing efficiency. (3) The DMOS has higher frequency response. (4) Program/Erase action is fast and it is electronically. There are several processing tokens in device design like self align use of ZnO film and ZnO masking resistance for non-reactive dry etching.

I claim:

1. In a piezoelectric double diffusion MOS structure having a silicon base with ZnO film thereon and a CVD oxide element between ZnO film and a gate connection; the improvement comprising adding overlapping layers of CVD polysilicon on top of the ZnO film; said overlapping layers being separated by thin oxide layers; said structure being formed on a silicon substrate; one of said overlapping layers is a floating gate which is coupled capacitively to the silicon substrate to form a transistor whereby the presence or absence of a charge on the floating gate determines whether the transistor is on or off; once a charge is on the floating gate the charge will remain trapped as the oxide forms a barrier to the flow of current; and another of the overlapping layers form the function of an erase gate for dissipating a trapped charge in the floating gate.

2. A structure as set forth in claim 2 wherein the overlapping layers are three in number, and the remaining layer is designed to be an electrical reference potential.

3. A structure as set forth in claim 2 wherein piezoelectric oxide and the floating gate combination provide an ability to store stressed induced charges in a large time-bandwidth convolution and correlation.

* * * * *